(12) United States Patent
Kang et al.

(10) Patent No.: US 12,506,478 B2
(45) Date of Patent: Dec. 23, 2025

(54) BUFFER CIRCUIT, SEMICONDUCTOR DEVICE, AND SIGNAL PROCESSING SYSTEM INCLUDING SEMICONDUCTOR DEVICE

(71) Applicant: SK hynix Inc., Icheon-si (KR)

(72) Inventors: Ji Hyo Kang, Icheon-si (KR); Hyun Bae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 128 days.

(21) Appl. No.: 18/498,852

(22) Filed: Oct. 31, 2023

(65) Prior Publication Data

US 2024/0348251 A1    Oct. 17, 2024

(30) Foreign Application Priority Data

Apr. 11, 2023   (KR) ................ 10-2023-0047569

(51) Int. Cl.
*H03K 19/00*    (2006.01)
*H03K 17/687*   (2006.01)

(52) U.S. Cl.
CPC ..... *H03K 19/0005* (2013.01); *H03K 17/6877* (2013.01)

(58) Field of Classification Search
CPC .......... H03K 19/0005; H03K 17/6877; H03K 19/0185; G11C 7/22; G11C 7/1051; G11C 7/1078; G11C 7/1057; G11C 7/1084
See application file for complete search history.

(56) References Cited

U.S. PATENT DOCUMENTS 10,447,206 B2 * 10/2019 Lee .............. H03F 3/195
2013/0241651 A1 * 9/2013 Yu .............. H03F 3/45071
330/253

FOREIGN PATENT DOCUMENTS

KR    101487110 B1    1/2015

* cited by examiner

*Primary Examiner* — Daniel D Chang
(74) *Attorney, Agent, or Firm* — WILLIAM PARK AND ASSOCIATES LTD.

(57) ABSTRACT

A buffer circuit may include a buffer unit including a first resistor connected between a power source terminal and a first node, a first inductor set connected between the first node and a first input terminal, a second resistor connected between the power source terminal and a second node, and a second inductor set connected between the second node and a second input terminal, and a first variable capacitance circuit connected between the first node and the second node, and configured to adjust a first capacitance value according to a plurality of first adjustment signals.

21 Claims, 5 Drawing Sheets

BUFFER CIRCUIT, SEMICONDUCTOR DEVICE, AND SIGNAL PROCESSING SYSTEM INCLUDING SEMICONDUCTOR DEVICE

CROSS-REFERENCES TO RELATED APPLICATION

The present application claims priority under 35 U.S.C. § 119 (a) to Korean application number 10-2023-0047569, filed on Apr. 11, 2023, in the Korean Intellectual Property Office, which is incorporated herein by reference in its entirety.

BACKGROUND

1. Technical Field

The present technology relates to a semiconductor circuit, and more particularly, to a buffer circuit, a semiconductor device, and a signal processing system including the semiconductor device.

2. Related Art

Semiconductor devices may transmit and receive clock signals and data to communicate with external devices. Semiconductor devices may each include a buffer circuit that generates an output signal by amplifying and/or buffering an input signal. As the loading of a signal transmission line, in particular, loading of a global signal line, which is the longest in a semiconductor device, increases, operating speed of the semiconductor devices and signal quality may deteriorate. In order to solve these problems, a plurality of repeaters are placed on the global signal line, but the placement of the repeaters increases current consumption and causes noise according to the increase in current consumption, and consequently, the signal quality may further deteriorate.

SUMMARY

A buffer circuit according to an embodiment of the present technology may include: a buffer unit including a first resistor connected between a power source terminal and a first node, a first inductor set connected between the first node and a first input terminal, a second resistor connected between the power source terminal and a second node, and a second inductor set connected between the second node and a second input terminal; and a first variable capacitance circuit connected between the first node and the second node, and configured to adjust a first capacitance value according to a plurality of first adjustment signals.

A buffer circuit according to an embodiment of the present technology may include: a buffer unit including an inductor circuit, and configured to buffer input signals, which are input through a first input terminal and a second input terminal, according to a power source voltage applied to the inductor circuit and configured to output the buffered signals through a first output terminal and a second output terminal; and a first variable capacitance circuit connected to the buffer unit, and configured to adjust a DC gain of the buffer unit by adjusting a first capacitance value according to a plurality of first adjustment signals.

A semiconductor device according to an embodiment of the present technology may include: a memory core; a buffer circuit including an inductor circuit, and configured to buffer input signals, which are input through a first input terminal and a second input terminal, according to a power source voltage applied to the inductor circuit, output the buffered signals, and adjust at least one of a first capacitance value, a second capacitance value and a resistance value, which are applied to the inductor circuit, according to a plurality of adjustment signals; a data input/output circuit configured to receive a data signal, which is input from an external device, according to an output signal of the buffer circuit, provide the memory core with the received data signal, and output data provided from the memory core to the external device; and a control circuit configured to determine a currently set adjustment mode according to a plurality of control signals and configured to generate the plurality of adjustment signals to meet the determined adjustment mode.

A signal processing system according to an embodiment of the present technology may include: a semiconductor device including a buffer circuit including an inductor circuit, and configured to buffer input signals, which are input through a first input terminal and a second input terminal, according to a power source voltage applied to the inductor circuit, output the buffered signals, and adjust at least one of a first capacitance value, a second capacitance value, and a resistance value, which are applied to the inductor circuit, according to a plurality of adjustment signals; and a host configured to provide the semiconductor device with clock signals and a command and address signal and configured to perform an adjustment signal optimization operation that controls values of the plurality of adjustment signals to be stored in the semiconductor device at a time at which an output of the semiconductor device satisfies a target condition while sequentially monitoring the output of the semiconductor device according to each of a first adjustment mode and a second adjustment mode.

DETAILED DESCRIPTION

Hereinafter, embodiments of the present technology will be described in more detail with reference to the accompanying drawings.

Figure 1:
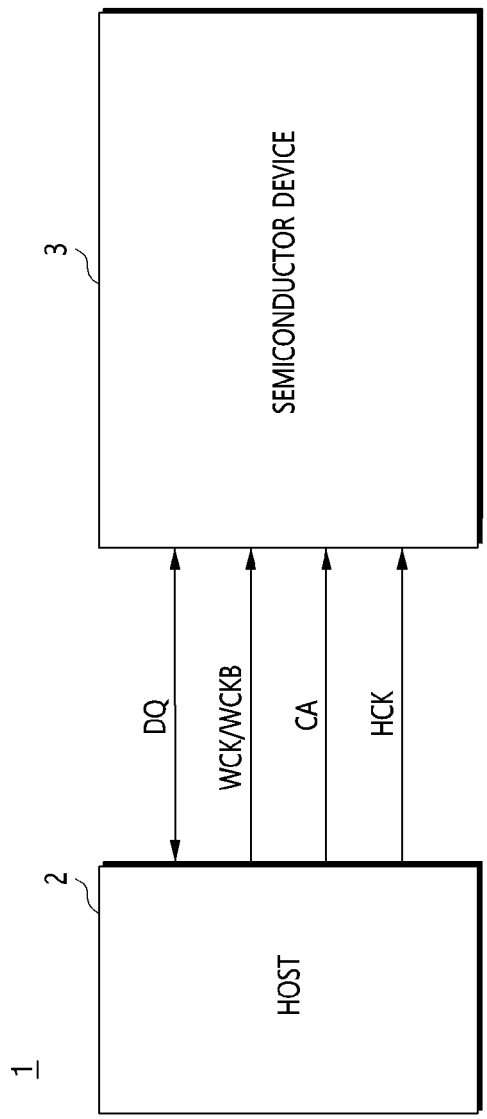
FIG. 1 is a diagram illustrating a configuration of a data processing system, according to an embodiment of the present technology.

FIG. 1 is a diagram illustrating a configuration of a data processing system 1, according to an embodiment of the present technology.

Referring to FIG. 1, the data processing system 1 according to the present embodiment may include a host 2 and a semiconductor device 3.

The host 2 may provide the semiconductor device 3 with clock signals HCK, WCK and WCKB, and a command and address signal CA. The host 2 may exchange data DATA with the semiconductor device 3 through a data channel DQ. Hereinafter, the clock signals HCK, WCK, and WCKB are referred to as external clock signals on the basis of the semiconductor device 3. The external clock signal HCK, which is a clock signal related to the command and address signal CA, may be used as a reference signal when the command and address signal CA is received by the semiconductor device 3. The external clock signals HCK, WCK and WCKB, which are clock signals related to the data DATA, may be used as reference signals when the data DATA is received by the semiconductor device 3.

The host 2 may be, for example, a memory controller or test equipment, such as a central processing unit (CPU) or a graphic processing unit (GPU). The host 2 may provide control signals for controlling at least one of the buffer circuits of the semiconductor device 3 to meet a first adjustment mode and a second adjustment mode. The first adjustment mode may be an operation mode for controlling a buffer circuit of the semiconductor device 3 to meet an operating frequency, i.e., a high/low frequency, and the second adjustment mode may an operation mode for controlling a buffer circuit of the semiconductor device 3 to meet a signal transmission method, i.e., a differential/single-ended type. For example, the host 2 may include operating frequency information and/or signal transmission method information in the command and address signal CA.

The semiconductor device 3 may be, for example, a memory device. The semiconductor device 3 may transmit the data DATA to the host 2 or receive the data DATA from the host 2 according to the command and address signal CA and the external clock signals HCK, WCK, and WCKB. The semiconductor device 3 may include the buffer circuits, such as a clock buffer and a data input buffer. The semiconductor device 3 may generate the control signals for controlling at least one of the buffer circuits according to the command and address signal CA.

Figure 2:
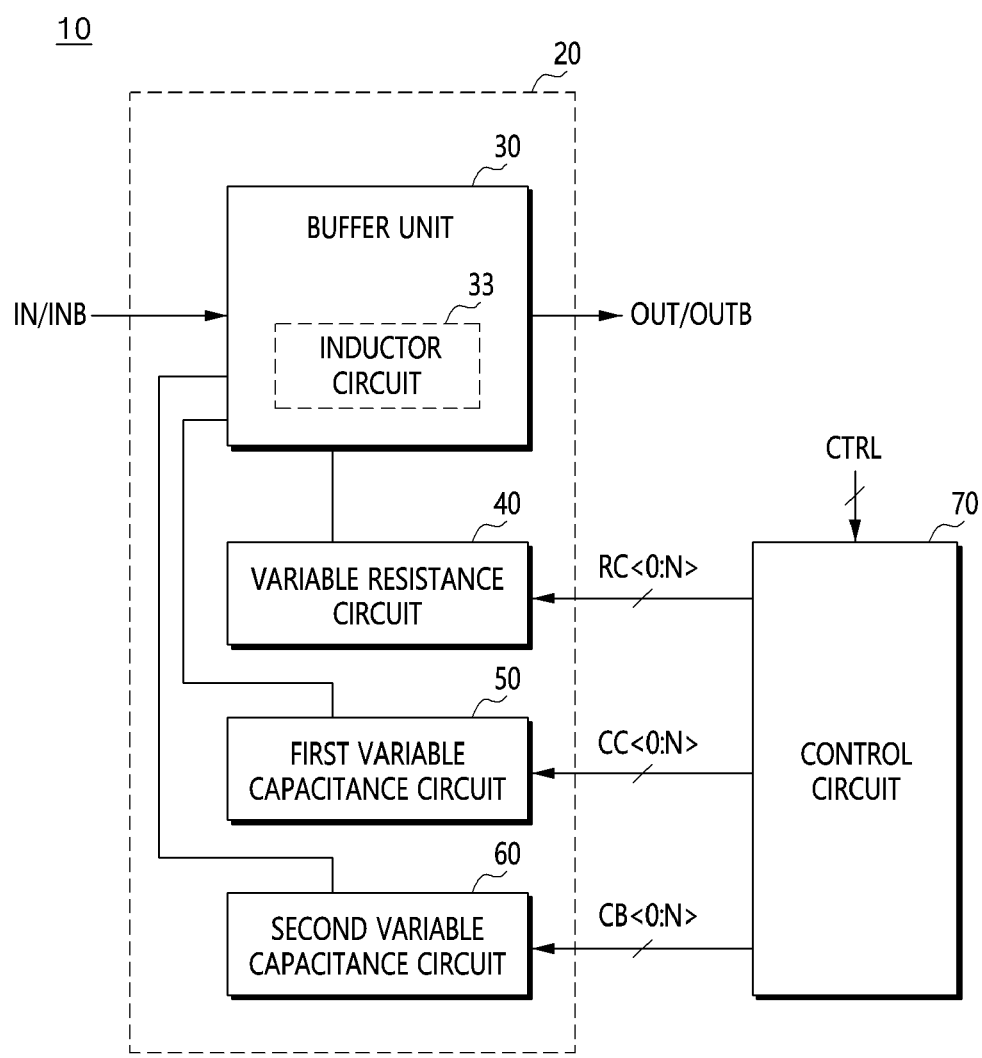
FIG. 2 is a diagram illustrating a configuration of a buffer circuit, according to an embodiment of the present technology.

FIG. 2 is a diagram illustrating a configuration of a buffer circuit 10, according to an embodiment of the present technology.

Referring to FIG. 2, the buffer circuit 10 according to the present embodiment may include a buffer unit 30, a first variable capacitance circuit 50, a second variable capacitance circuit 60, a variable resistance circuit 40, and a control circuit 70.

The buffer unit 30 may include an inductor circuit 33 and may be configured to buffer an input signal, which is input through first and second input terminals IN/INB, according to a power source voltage applied to the inductor circuit 33 and configured to output the buffered input signal through first and second output terminals OUT/OUTB. When the buffer unit 30 is applied to a semiconductor device that operates in a differential mode, a differential input signal may be input through the first input terminal IN and the second input terminal INB. When the buffer unit 30 is applied to a semiconductor device that operates in a single-ended mode, an input signal may be input through one of the first input terminal IN and the second input terminal INB, and a reference voltage may be applied to the other one of the first input terminal IN and the second input terminal INB.

The first variable capacitance circuit 50 may be connected to the buffer unit 30 and may be configured to adjust a first capacitance value, which is applied to the inductor circuit 33, according to a plurality of first adjustment signals CC<0:N>. A gain of the buffer unit 30 may be adjusted by the variation of the first capacitance value.

The second variable capacitance circuit 60 may be connected to the buffer unit 30 and may be configured to adjust a second capacitance value, which is applied to the inductor circuit 33, according to a plurality of second adjustment signals CB<0:N>. The bandwidth of the buffer unit 30 may be adjusted through the variation of the second capacitance value.

The variable resistance circuit 40 may be connected to the buffer unit 30 and may be configured to adjust a resistance value according to a plurality of third adjustment signals RC<0:N>. A low frequency gain of the buffer unit 30 may be adjusted through the variation of the resistance value.

The control circuit 70 may determine a currently set adjustment mode (the first adjustment mode/the second adjustment mode) according to a plurality of control signals CTRL and may generate the plurality of first adjustment signals CC<0:N>, the plurality of second adjustment signals CB<0:N>, and the plurality of third adjustment signals RC<0:N> to meet the determined adjustment mode. The command and address signal CA may be used as the plurality of control signals CTRL.

The control circuit 70 may adjust at least one of the plurality of first adjustment signals CC<0:N>, the plurality of second adjustment signals CB<0:N>, and the plurality of third adjustment signals RC<0:N> to meet the operating frequency in the first adjustment mode. The control circuit 70 may simultaneously adjust two or more of the plurality of first adjustment signals CC<0:N>, the plurality of second adjustment signals CB<0:N>, and the plurality of third adjustment signals RC<0:N> to meet the operating frequency in the first adjustment mode. The control circuit 70 may adjust the plurality of first adjustment signals CC<0:N> to meet the signal transmission method in the second adjustment mode.

An adjustment signal optimization operation that optimizes values of the plurality of first adjustment signals CC<0:N>, the plurality of second adjustment signals CB<0:N>, and the plurality of third adjustment signals RC<0:N> may be performed prior to the control circuit 70 outputting the adjustment signals for the operating frequency, i.e., each of the high frequency and the low frequency of the first adjustment mode and the signal transmission method, i.e., each of the differential type and the single-ended type of the second adjustment mode. The values of the plurality of first adjustment signals CC<0:N>, the plurality of second adjustment signals CB<0:N>, and the plurality of third adjustment signals RC<0:N>, according to the adjustment signal optimization operation, may be stored in a storage circuit (not illustrated) of the control circuit 70.

The above-described adjustment signal optimization operation may be performed in the following manner.

A host, for example, the host 2 of FIG. 1, may provide a semiconductor device with the plurality of control signals CTRL to meet the first adjustment mode and the second adjustment mode, thereby adjusting the values of the plurality of first adjustment signals CC<0:N>, the plurality of second adjustment signals CB<0:N>, and the plurality of third adjustment signals RC<0:N>.

The host 2 may perform the adjustment signal optimization operation by allowing the values of the plurality of first adjustment signals CC<0:N>, the plurality of second adjustment signals CB<0:N>, and the plurality of third adjustment signals RC<0:N> to be stored in the control circuit 70 at the time at which an output of the semiconductor device satisfies a target condition while sequentially monitoring the corresponding output of the semiconductor device according to each of a high frequency condition of the first adjustment mode, a low frequency condition of the first adjustment mode, the differential type of the second adjustment mode, and the single-ended type of the second adjustment mode.

Meanwhile, after the adjustment signal optimization operation has been completely performed, the host 2 may include the plurality of adjustment mode signals for distinguishing the high frequency condition of the first adjustment mode, the low frequency condition of the first adjustment mode, the differential type of the second adjustment mode, and the single-ended type of the second adjustment mode in the plurality of control signals CTRL and may provide the plurality of adjustment mode signals included in the plurality of control signals CTRL. The control circuit 70 may determine the currently set adjustment mode, i.e., the first adjustment mode/second adjustment mode, according to the plurality of adjustment mode signals and may select and output the values of the plurality of first adjustment signals CC<0:N>, the plurality of second adjustment signals CB<0:N>, and the plurality of third adjustment signals RC<0:N> to meet the determined adjustment mode.

The plurality of adjustment mode signals may include, for example, first adjustment mode signals MD1<0:4> and second adjustment mode signals MD2<0:1>.

Among the first adjustment mode signals MD1<0:4>, the adjustment mode signal MD1<0>, which is a signal that defines an activation of the first adjustment mode, may define the activation of the first adjustment mode at a high level and define a deactivation of the first adjustment mode at a low level. The adjustment mode signal MD1<1>, which is a signal that defines a high/low frequency, may define the low frequency at a low level, and define the high frequency at a high level. The adjustment mode signals MD<2:4> may be used as signals for selecting at least one of the plurality of first adjustment signals CC<0:N>, the plurality of second adjustment signals CB<0:N>, and the plurality of third adjustment signals RC<0:N>, which is to be adjusted.

Among the second adjustment mode signals MD2<0:1>, the adjustment mode signal MD2<0>, which is a signal that defines an activation of the second adjustment mode, may define the activation of the second adjustment mode at a high level, and define a deactivation of the second adjustment mode at a low level. The adjustment mode signal MD2<1>, which is a signal that defines the differential type/single-ended type, may define the differential type at a low level, and define the single-ended type at a high level.

Figure 3:
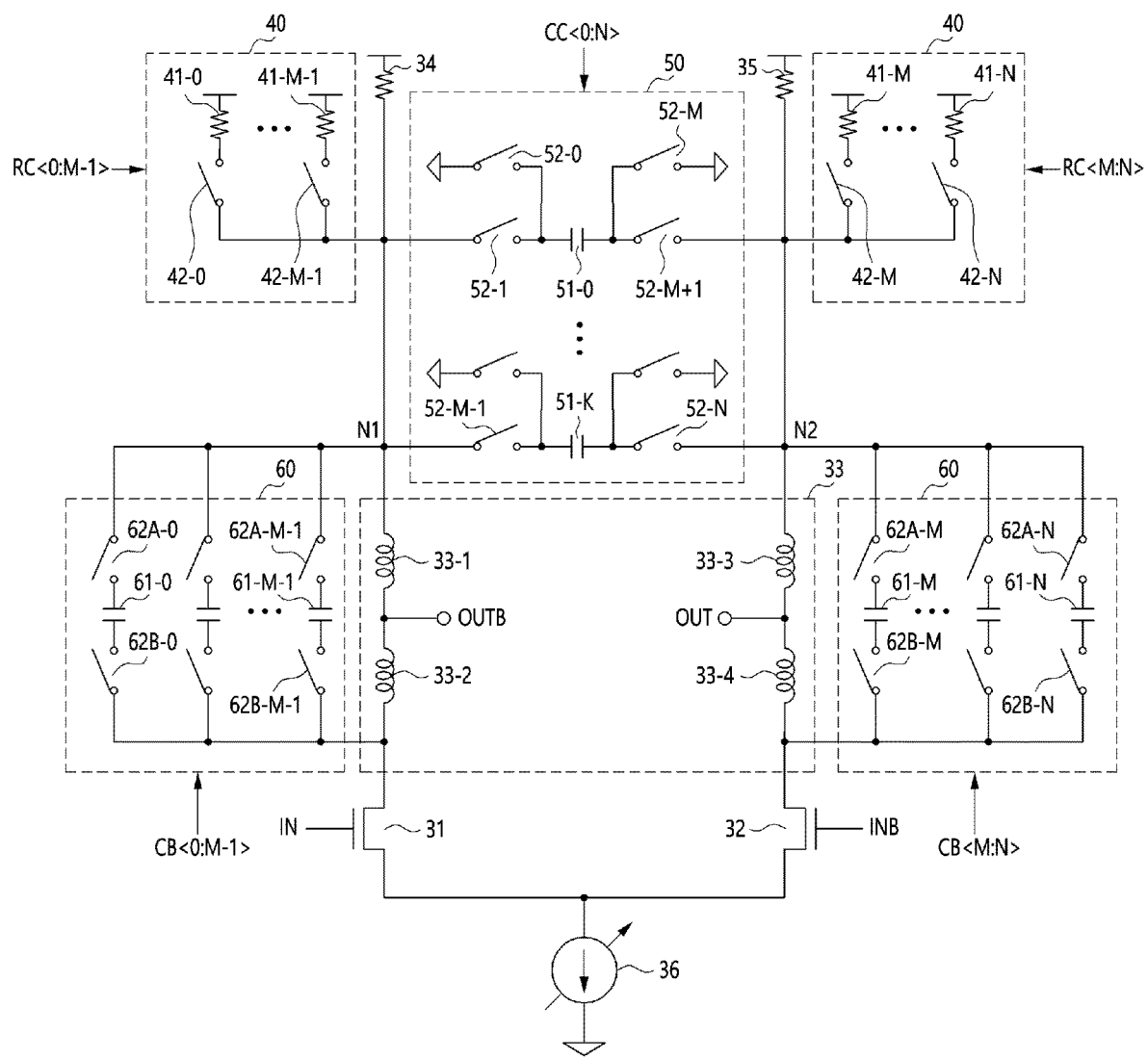
FIG. 3 is a diagram illustrating a detailed configuration of the buffer circuit illustrated in FIG. 2.

FIG. 3 is a diagram illustrating a detailed configuration of the buffer circuit 10, illustrated in FIG. 2.

Referring to FIG. 3, the buffer unit 30 may include a plurality of transistors 31 and 32, an inductor circuit 33, and a plurality of resistors 34 and 35. A variable current source 36 may be further included between first and second input terminals IN/INB and a ground terminal.

The inductor circuit 33 may include a plurality of inductors, that is, first to fourth inductors 33-1 to 33-4. A first inductor set including the first and second inductors 33-1 to 33-2 may be connected between a first node N1 and the first input terminal IN, and a second inductor set including the third and fourth inductors 33-3 to 33-4 may be connected between a second node N2 and the second input terminal INB. Any one of first and second output terminals OUT/OUTB, for example, the second output terminal OUTB, may be connected to a node to which the first inductor 33-1 and the second inductor 33-2 are connected. The other of the first and second output terminals OUT/OUTB, for example, the first output terminal OUT, may be connected to a node to which the third inductor 33-3 and the fourth inductor 33-4 are connected.

Among the plurality of transistors 31 and 32, the first transistor 31 may have a drain terminal connected to the second inductor 33-2, a source terminal connected to the variable current source 36, and a gate terminal used as the first input terminal IN. The second transistor 32 may have a drain terminal connected to the fourth inductor 33-4, a source terminal connected to the variable current source 36, and a gate terminal used as the second input terminal INB.

Among the plurality of resistors 34 and 35, the first resistor 34 may be connected between a power source terminal and the first node N1, and the second resistor 35 may be connected between the power source terminal and the second node N2.

The first variable capacitance circuit 50 may be connected between the first node N1 and the second node N2.

The first variable capacitance circuit 50 may include a plurality of first capacitors 51-0 to 51-K and a plurality of switches 52-0 to 52-N. The plurality of first capacitors 51-0 to 51-K may be designed to have the same capacitance value or may be designed to have different capacitance values. Two switches, among the plurality of switches 52-0 to 52-N, may be connected to one end of a first capacitor, among the first capacitors 51-0 to 51-K, and two other switches, among the plurality of switches 52-0 to 52-N, may be connected to the other end of the same first capacitor, among the plurality of capacitors 51-0 to 51-K. Among the two switches connected to one end of the first capacitor, among the plurality of first capacitors 51-0 to 51-K, the other end of one switch may be connected to the ground terminal, and the other end of the other switch may be connected to the first node N1. Among the two other switches connected to the other end of the first capacitor, among the plurality of first capacitors 51-0 to 51-K, the other end of one switch may be connected to the ground terminal, and the other end of the other switch may be connected to the second node N2. The plurality of switches 52-0 to 52-N may connect the plurality of first capacitors 51-0 to 51-K between the first node N1 and the second node N2 in response to the plurality of first adjustment signals CC<0:N>. On the other hand, the plurality of switches 52-0 to 52-N may connect the plurality of first capacitors 51-0 to 51-K between the ground terminal and the first node N1 in response to the plurality of first adjustment signals CC<0:N>. The plurality of switches 52-0 to 52-N may connect the plurality of first capacitors 51-0 to 51-K between the ground terminal and the second node N2 in response to the plurality of first adjustment signals CC<0:N>.

For example, assuming that among the plurality of first adjustment signals CC<0:N>, the first adjustment signal CC<0> has a low level, the first adjustment signal CC<1> has a high level, the first adjustment signal CC<M> has a low level, and the first adjustment signal CC<0:M+1> has a high level, the capacitor 51-0 may be connected between the first node N1 and the second node N2, the switches 52-0 and 52-M being turned off and the switches 52-1 and 52-M+1 being turned on.

In another example, assuming that among the plurality of first adjustment signals CC<0:N>, the first adjustment signal CC<0> has a low level, the first adjustment signal CC<1> has a high level, the first adjustment signal CC<M> has a high level, and the first adjustment signal CC<0:M+1> has a low level, the capacitor 51-0 may be connected between the ground terminal and the first node N1, the switches 52-0 and 52-M+1 being turned off and the switches 52-1 and 52-M being turned on.

In yet another example, assuming that among the plurality of first adjustment signals CC<0:N>, the first adjustment signal CC<0> has a high level, the first adjustment signal CC<1> has a low level, the first adjustment signal CC<M> has a low level, and the first adjustment signal CC<0:M+1> has a high level, the capacitor 51-0 may be connected between the ground terminal and the second node N2, the switches 52-0 and 52-M+1 being turned on and the switches 52-1 and 52-M being turned off.

The second variable capacitance circuit 60 may be connected in parallel with the first inductor set of the inductor circuit 33 between the first node N1 and the first input terminal IN and may be connected in parallel with the second inductor set of the inductor circuit 33 between the second node N2 and the second input terminal INB.

The second variable capacitance circuit 60 may include a plurality of second capacitors 61-0 to 61-N and a plurality of switches 62A-0 to 62A-N and 62B-0 to 62B-N. The plurality of second capacitors 61-0 to 61-N may be designed to have the same capacitance value or may be designed to have different capacitance values. Among the plurality of switches 62A-0 to 62A-N and 62B-0 to 62B-N, one end of the plurality of switches 62A-0 to 62A-M−1 may be connected to the first node N1, one end of the plurality of switches 62A-M to 62A-N may be connected to the second node N2, one end of the plurality of switches 62B-0 to 62B-M−1 may be connected to the drain terminal of the first transistor 31, and one end of the plurality of switches 62B-M to 62B-N may be connected to the drain terminal of the second transistor 32. Each of the plurality of second capacitors 61-0 to 61-N may be connected to the other ends of two corresponding switches, among the plurality of switches 62A-0 to 62A-N and 62B-0 to 62B-N. The plurality of switches 62A-0 to 62A-N and 62B-0 to 62B-N may connect the plurality of second capacitors 61-0 to 61-N to the buffer unit 30 according to the plurality of second adjustment signals CB<0:N>. The plurality of switches 62A-0 to 62A-N and 62B-0 to 62B-N may connect the plurality of second capacitors 61-0 to 61-N in parallel with the inductor circuit 33 of the buffer unit 30 according to signal bits of the plurality of second adjustment signals CB<0:N>, respectively, in a pair unit 62A/62B.

For example, assuming that among the plurality of second adjustment signals CB<0:N>, second adjustment signals CB<0> and CB<N> each have a high level, and the other second adjustment signals CB<1:N−1> each have a low level, only the capacitors 61-0 and 61-N, among the plurality of second capacitors 61-0 to 61-N, may be connected in parallel with the inductor circuit 33 of the buffer unit 30, the pairs of the switches 62A-0/62B-0 and 62A-N/62B-N being turned on, and the other pairs of the switches 62A-1 to 62A-N−1 and 62B-1 to 62B-N−1 being all turned off.

The variable resistance circuit 40 may be connected in parallel with the first resistor 34 between the first resistor 34 of the buffer unit 30 and the first node N1 and may be connected in parallel with the second resistor 35 between the second resistor 35 of the buffer unit 30 and the second node N2.

The variable resistance circuit 40 may include a plurality of resistors 41-0 to 41-N and a plurality of switches 42-0 to 42-N. The plurality of resistors 41-0 to 41-N may be designed to have the same resistance value or may be designed to have different resistance values. One end of each of the plurality of resistors 41-0 to 41-N may be connected to the power source terminal, and the other end of each of the plurality of resistors 41-0 to 41-N may be connected to one end of each of the plurality of switches 42-0 to 42-N, respectively, in a one-to-one manner. Among the plurality of switches 42-0 to 42-N, the other end of the switches 42-0 to 42-M−1 may be connected in parallel with the first resistor 34 of the buffer unit 30, and the other end of the other switches 42-M to 42-N may be connected in parallel with the second resistor 35 of the buffer unit 30. Switches 42-0 to 42-M−1, among the plurality of switches 42-0 to 42-N, may connect resistors 41-0 to 41-M−1, among the plurality of resistors 41-0 to 41-N, to be in parallel with the first resistor 34 of the buffer unit 30 in response to some bits RC<0:M−1> of the plurality of third adjustment signals RC<0:N>. The other switches 42-M to 42-N, among the plurality of switches 42-0 to 42-N, may connect the other resistors 41-M to 41-N, among the plurality of resistors 41-0 to 41-N, to be in parallel with the second resistor 35 of the buffer unit 30 in response to the other bits RC<M:N> of the plurality of third adjustment signals RC<0:N>.

For example, assuming that among the plurality of third adjustment signals RC<0:N>, the third adjustment signal RC<0> has a high level, and the other third adjustment signals RC<1:N> each have a low level, only the resistor 41-0, among the plurality of resistors 41-0 to 41-N, may be connected in parallel with the first resistor 34 of the buffer unit 30, the switch 42-0 being turned on and the other switches 42-1 to 42-N being all turned off.

Figure 4:
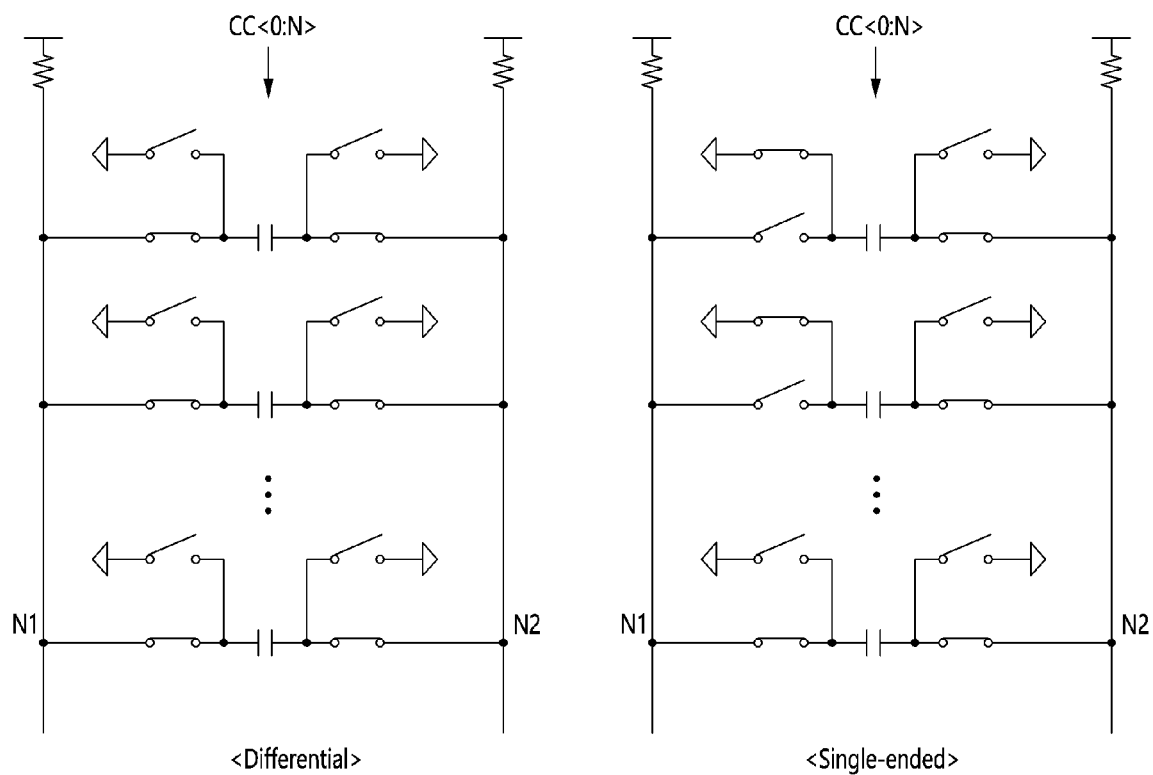
FIG. 4 is a diagram illustrating an example of an operation of a first variable capacitance circuit illustrated in FIG. 3 according to a second adjustment mode.

FIG. 4 is a diagram illustrating an example of an operation of the first variable capacitance circuit 50, illustrated in FIG. 3, according to the second adjustment mode.

When the currently set adjustment mode is determined as the second adjustment mode according to the plurality of control signals CTRL (i.e., the adjustment mode signal MD2<0>, among the second adjustment mode signals MD2<0:1>, has a high level), the control circuit 70 may variably adjust the values of the plurality of first adjustment signals CC<0:N> according to the signal transmission method.

When the signal transmission method is the differential type (i.e., the adjustment mode signal MD2<1> has a low level), the control circuit 70 may select and output a value corresponding to the differential type of the second adjustment mode, among the values of the plurality of first adjustment signals CC<0:N>, stored through the above-described adjustment signal optimization operation. Therefore, as the number of capacitors connected between the first node N1 and the second node N2 becomes the same, the capacitance of the first node N1 and the capacitance of the second node N2 may be symmetrical so that the buffer circuit 10 may be optimized for the differential type.

When the signal transmission method is the single-ended type (i.e., the adjustment mode signal MD2<1> has a high level), the control circuit 70 may select and output a value corresponding to the single-ended type of the second adjustment mode, among the values of the plurality of first adjustment signals CC<0:N>, stored through the above-described adjustment signal optimization operation. Therefore, as the capacitance of the first node N1 and the capacitance of the second node N2 are adjusted to have different values by making the number of capacitors connected to the first node N1 and the number of capacitors connected to the second node N2 to be different, the buffer circuit 10 may be optimized for the single-ended type.

In the single-ended type, one of the first input terminal and the second input terminal, for example, an input terminal to which the reference voltage is applied, has a relatively small swing width. Accordingly, an output imbalance occurs between the first output terminal OUT and the second output terminal OUTB, and the capacitance of the first node N1 and the capacitance of the second node N2 may be adjusted to have different values so as to offset the output imbalance between the first output terminal OUT and the second output terminal OUTB, which makes it possible to compensate for the output imbalance.

Figure 5:
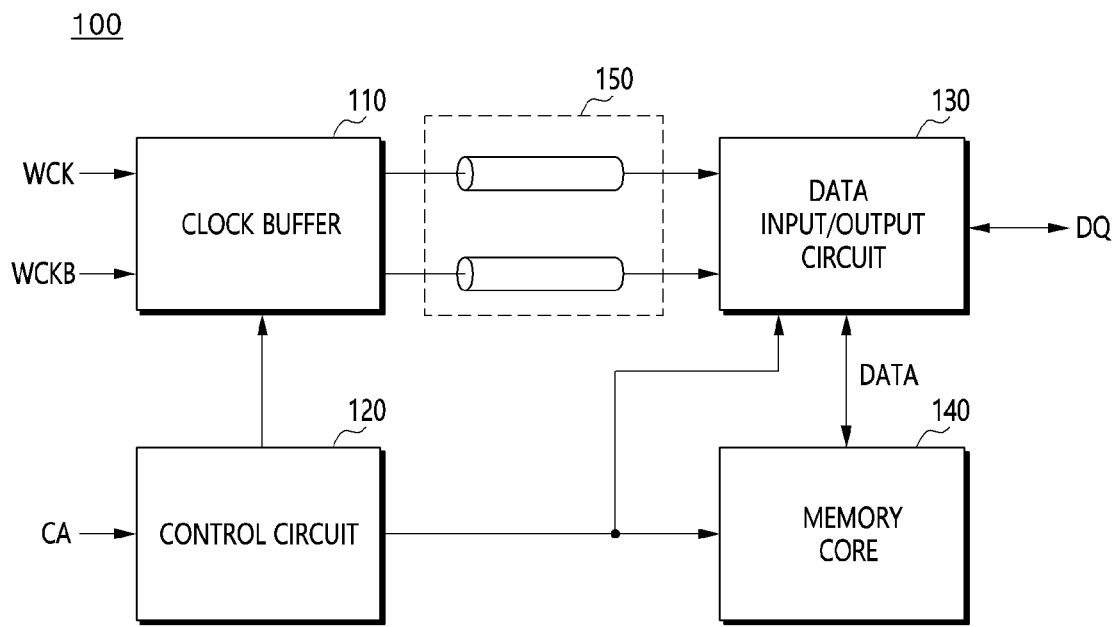
FIG. 5 is a diagram illustrating a configuration of a semiconductor device, according to an embodiment of the present technology.

FIG. 5 is a diagram illustrating an example of a configuration of a semiconductor device 100, according to an embodiment of the present technology.

Referring to FIG. 5, the semiconductor device 100 according to the present embodiment may include a clock buffer 110, a control circuit 120, a data input/output circuit 130, a memory core 140, and a global signal line 150.

The semiconductor device 100 may be configured to receive a differential type of a clock signal as an example.

The clock buffer 110 may buffer external clock signals (i.e., differential clock signals WCK and WCKB) and may output the buffered clock signals to the global signal line 150. The clock buffer 110 may have the same configuration as the buffer circuit 10, described above with reference to FIGS. 2 to 4.

The data input/output circuit 130 may receive a data through the data channel DQ, which is input from a device external to the semiconductor device 100, according to the clock signal transmitted through the global signal line 150. The data input/output circuit 130 may output data, which is provided from the memory core 140, to the device external to the semiconductor device 100 or may provide the memory core 140 with data provided from the device external to the semiconductor device 100.

The control circuit 120 may control the clock buffer 110, the data input/output circuit 130, and the memory core 140 according to a command and address signal CA. The control circuit 120 may control the clock buffer 110 in the same manner as the control circuit 70, described above with reference to FIG. 2.

The buffer circuit 10 may prevent operating speed deterioration and signal quality deterioration due to an increase in signal line loading by applying the first variable capacitance circuit 50, the second variable capacitance circuit 60 and the variable resistance circuit 40. Accordingly, since it is not necessary to connect a repeater onto the global signal line 150 as the clock buffer 110 having the same configuration as the buffer circuit 10 is applied to the semiconductor device 100 according to an embodiment of the present technology, current consumption may be reduced, and noise caused by the repeater may also be reduced.

Figure 6:
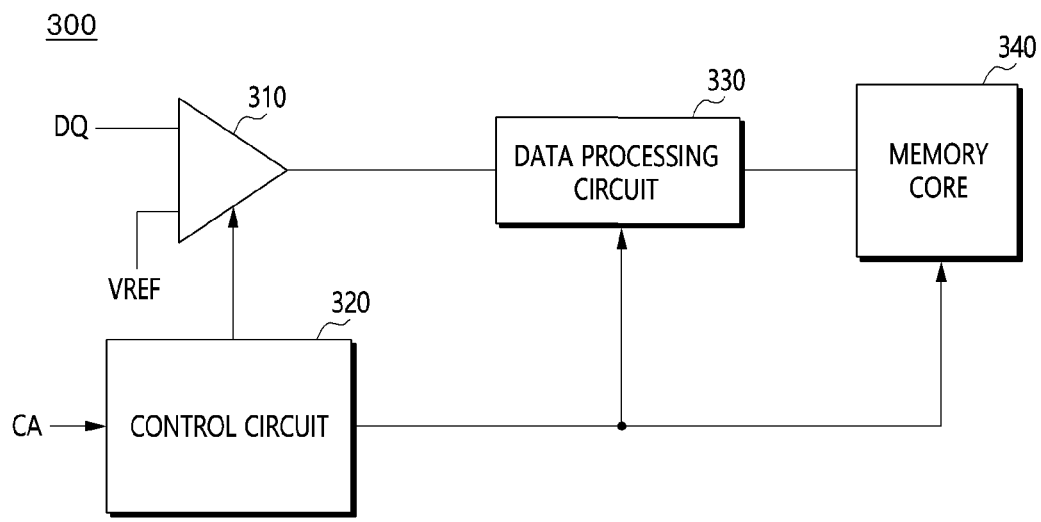
FIG. 6 is a diagram illustrating a configuration of a semiconductor device, according to another embodiment of the present technology.

FIG. 6 is a diagram illustrating a configuration of a semiconductor device 300, according to another embodiment of the present technology.

Referring to FIG. 6, the semiconductor device 300 according to the present embodiment may include an input buffer 310, a control circuit 320, a data processing circuit 330, and a memory core 340.

The semiconductor device 300 is configured to receive a single-ended type of a data signal as an example.

The input buffer 310 may buffer a data input through the data channel DQ according to a reference voltage VREF and may output the buffered data signal. The input buffer 310 may have the same configuration as the buffer circuit 10, described above with reference to FIGS. 2 to 4.

The data processing circuit 330 may perform a parallelization operation on data output from the input buffer 310 and may provide the memory core 340 with the parallelized data.

The control circuit 320 may control the input buffer 310, the data processing circuit 330, and the memory core 340 according to a command and address signal CA. The control circuit 320 may control the input buffer 310 in the same manner as the control circuit 70, described above with reference to FIG. 2.

The buffer circuit 10 may control the first variable capacitance circuit 50 to meet the differential type/single-ended type of the second adjustment mode, thereby optimizing the buffer circuit 10 for each of the differential type and the single-ended type. In particular, in the single-ended type, the capacitance of the first node N1 and the capacitance of the second node N2 may be adjusted to have different values, which makes it possible to compensate for output imbalance.

A person skilled in the art to which the present technology pertains can understand that the present technology may be carried out in other specific forms without changing its technical spirit or essential features. Therefore, it should be understood that the embodiments described above are illustrative in all aspects, not limitative. The scope of the present technology is defined by the claims to be described below rather than the detailed description, and it should be construed that the meaning and scope of the claims and all changes or modified forms derived from the equivalent concept thereof are included in the scope of the present technology.

What is claimed is:

1. A buffer circuit comprising:
   a buffer unit including a first resistor connected between a power source terminal and a first node, a first inductor set connected between the first node and a first input terminal, a second resistor connected between the power source terminal and a second node, and a second inductor set connected between the second node and a second input terminal; and
   a first variable capacitance circuit connected between the first node and the second node and configured to adjust a first capacitance value according to a plurality of first adjustment signals; and
   a control circuit configured to adjust the plurality of first adjustment signals to meet an operating frequency in a first adjustment mode and adjust the plurality of first adjustment signals to meet a signal transmission method in a second adjustment mode.

2. The buffer circuit according to claim 1, wherein the control circuit is further configured to, when the signal transmission method is a single-ended type, adjust values of the plurality of first adjustment signals to adjust a capacitance of the first node and a capacitance of the second node to have different values.

3. The buffer circuit according to claim 1, further comprising a second variable capacitance circuit connected in parallel with each of the first inductor set and the second inductor set and configured to adjust a second capacitance value according to a plurality of second adjustment signals.

4. The buffer circuit according to claim 3, further comprising a variable resistance circuit connected to each of the first resistor and the second resistor and configured to adjust a resistance value according to a plurality of third adjustment signals.

5. The buffer circuit according to claim 4, wherein the control circuit is further configured to determine a set adjustment mode according to a plurality of control signals and configured to generate the plurality of first adjustment signals, the plurality of second adjustment signals, and the plurality of third adjustment signals to meet the determined adjustment mode.

6. The buffer circuit according to claim 4, wherein the control circuit is further configured to adjust at least one of the plurality of first adjustment signals, the plurality of second adjustment signals, and the plurality of third adjustment signals to meet the operating frequency in the first adjustment mode and configured to adjust the plurality of first adjustment signals to meet the signal transmission method in the second adjustment mode.

7. A buffer circuit comprising:
a buffer unit including an inductor circuit and configured to buffer input signals, which are input through a first input terminal and a second input terminal, according to a power source voltage applied to the inductor circuit and configured to output the buffered signals through a first output terminal and a second output terminal;
a first variable capacitance circuit connected to the buffer unit and configured to adjust a gain of the buffer unit by adjusting a first capacitance value according to a plurality of first adjustment signals; and
a control circuit configured to adjust the plurality of first adjustment signals to meet an operating frequency in a first adjustment mode and adjust the plurality of first adjustment signals to meet a signal transmission method in a second adjustment mode.

8. The buffer circuit according to claim 7, further comprising:
a second variable capacitance circuit connected to the buffer unit and configured to adjust a bandwidth of the buffer unit by adjusting a second capacitance value according to a plurality of second adjustment signals; and
a variable resistance circuit connected to the buffer unit and configured to adjust a low frequency gain of the buffer unit by adjusting a resistance value according to a plurality of third adjustment signals.

9. The buffer circuit according to claim 8, wherein the control circuit is further configured to determine a currently set adjustment mode according to a plurality of control signals and configured to generate the plurality of first adjustment signals, the plurality of second adjustment signals, and the plurality of third adjustment signals to meet the determined adjustment mode.

10. The buffer circuit according to claim 8, wherein the control circuit is further configured to adjust at least one of the plurality of first adjustment signals, the plurality of second adjustment signals, and the plurality of third adjustment signals to meet the operating frequency in the first adjustment mode and configured to adjust the plurality of first adjustment signals to meet the signal transmission method in the second adjustment mode.

11. A semiconductor device comprising:
a memory core;
a buffer circuit including an inductor circuit and configured to buffer input signals, which are input through a first input terminal and a second input terminal, according to a power source voltage applied to the inductor circuit, output the buffered signals, and adjust at least one of a first capacitance value, a second capacitance value, and a resistance value, which are applied to the inductor circuit, according to a plurality of adjustment signals;
a data input/output circuit configured to receive a data signal, which is input from an external device, according to an output signal of the buffer circuit, provide the memory core with the received data signal, and output data provided from the memory core to the external device; and
a control circuit configured to determine a currently set adjustment mode according to a plurality of control signals and configured to generate the plurality of adjustment signals to meet the determined adjustment mode.

12. The semiconductor device according to claim 11, wherein the buffer circuit includes:
a buffer unit including a first resistor connected between a power source terminal and a first node, a first inductor set connected between the first node and a first input terminal, a second resistor connected between the power source terminal and a second node, and a second inductor set connected between the second node and a second input terminal; and
a first variable capacitance circuit connected between the first node and the second node and configured to adjust the first capacitance value according to a plurality of first adjustment signals among the plurality of adjustment signals.

13. The semiconductor device according to claim 12, wherein, when the determined adjustment mode is a second adjustment mode and a signal transmission method of the second adjustment mode is a single-ended type, the control circuit adjusts values of the plurality of first adjustment signals so that capacitance of the first node and capacitance of the second node have different values.

14. The semiconductor device according to claim 12, further comprising a second variable capacitance circuit connected in parallel with each of the first inductor set and the second inductor set and configured to adjust the second capacitance value according to a plurality of second adjustment signals, among the plurality of adjustment signals.

15. The semiconductor device according to claim 14, further comprising a variable resistance circuit connected to each of the first resistor and the second resistor and configured to adjust the resistance value according to a plurality of third adjustment signals, among the plurality of adjustment signals.

16. A signal processing system comprising:
a semiconductor device including a buffer circuit including an inductor circuit, and configured to buffer input signals, which are input through a first input terminal and a second input terminal, according to a power source voltage applied to the inductor circuit, output the buffered signals, and adjust at least one of a first capacitance value, a second capacitance value, and a resistance value, which are applied to the inductor circuit, according to a plurality of adjustment signals; and
a host configured to provide the semiconductor device with clock signals and a command and address signal and configured to perform an adjustment signal optimization operation that controls values of the plurality of adjustment signals to be stored in the semiconductor device at a time at which an output of the semiconductor device satisfies a target condition while sequentially monitoring the output of the semiconductor device according to each of a first adjustment mode and a second adjustment mode.

17. The signal processing system according to claim 16, wherein the semiconductor device is configured to adjust at least one of the first capacitance value, the second capacitance value, and the resistance value to meet an operating frequency in the first adjustment mode and to adjust the first capacitance value to meet a signal transmission method in the second adjustment mode.

18. The signal processing system according to claim 16, wherein the host is configured to provide a plurality of adjustment mode signals for distinguishing an operating frequency condition of the first adjustment mode and a signal transmission method of the second adjustment mode after the adjustment signal optimization operation has been completely performed.

19. The signal processing system according to claim 18, wherein the semiconductor device is configured to determine a currently set adjustment mode according to the plurality of adjustment mode signals and configured to select and output corresponding values, among the values of the plurality of adjustment signals stored therein, to meet the predetermined adjustment mode.

20. The signal processing system according to claim 16, wherein the buffer circuit includes:

a buffer unit including a first resistor connected between a power source terminal and a first node, a first inductor set connected between the first node and a first input terminal, a second resistor connected between the power source terminal and a second node, and a second inductor set connected between the second node and a second input terminal; and a first variable capacitance circuit connected between the first node and the second node and configured to adjust the first capacitance value according to a plurality of first adjustment signals among the plurality of adjustment signals.

21. The signal processing system according to claim 20, wherein the semiconductor device adjusts values of the plurality of first adjustment signals so that a capacitance of the first node and a capacitance of the second node have different values when a signal transmission method of the second adjustment mode is a single-ended type.

* * * * *